US009123546B2

(12) United States Patent
Lin et al.

(10) Patent No.: US 9,123,546 B2
(45) Date of Patent: Sep. 1, 2015

(54) MULTI-LAYER SEMICONDUCTOR DEVICE STRUCTURES WITH DIFFERENT CHANNEL MATERIALS

(71) Applicant: Taiwan Semiconductor Manufacturing Company Limited, Hsinchu (TW)

(72) Inventors: Yi-Tang Lin, Hsinchu (TW); Clement Hsingjen Wann, New York, NY (US); Chih-Hsin Ko, Kaohsiung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/080,138

(22) Filed: Nov. 14, 2013

(65) Prior Publication Data

US 2015/0129891 A1    May 14, 2015

(51) Int. Cl.
| | |
|---|---|
| *H01L 21/336* | (2006.01) |
| *H01L 27/06* | (2006.01) |
| *H01L 29/16* | (2006.01) |
| *H01L 29/20* | (2006.01) |

(52) U.S. Cl.
CPC ........ *H01L 27/0623* (2013.01); *H01L 27/0629* (2013.01); *H01L 29/16* (2013.01); *H01L 29/1608* (2013.01); *H01L 29/2003* (2013.01)

(58) Field of Classification Search
CPC .................. H01L 21/76262; H01L 21/76264; H01L 21/8258; H01L 29/1606
USPC .............................................. 438/285; 257/29
See application file for complete search history.

(56) References Cited

U.S. PATENT DOCUMENTS

| | | |
|---|---|---|
| 8,581,349 B1 | 11/2013 | Sekar et al. |
| 2006/0110851 A1 | 5/2006 | Burrell et al. |
| 2011/0233702 A1 | 9/2011 | Takahashi et al. |
| 2012/0314511 A1 | 12/2012 | Ishikawa |
| 2013/0037780 A1* | 2/2013 | Kivioja et al. .................. 257/26 |
| 2013/0082235 A1* | 4/2013 | Gu et al. ............................ 257/9 |
| 2013/0193408 A1* | 8/2013 | Hwang et al. .................. 257/13 |

* cited by examiner

*Primary Examiner* — Caridad Everhart
(74) *Attorney, Agent, or Firm* — Jones Day

(57) ABSTRACT

Systems and methods are provided for fabricating a semiconductor device structure. An example semiconductor device structure includes a first device layer and a second device layer formed on a first device layer. The first device layer is formed on a substrate and includes a first channel structure configured to conduct a first current, the first channel structure including a first material capable of sustaining a first processing temperature. The second device layer includes a second channel structure configured to conduct a second current, the second channel structure including a second material capable of sustaining a second processing temperature, the second processing temperature being equal to or lower than the first processing temperature.

20 Claims, 21 Drawing Sheets

MULTI-LAYER SEMICONDUCTOR DEVICE STRUCTURES WITH DIFFERENT CHANNEL MATERIALS

FIELD

The technology described in this disclosure relates generally to semiconductor device structures and more particularly to multi-layer structures.

BACKGROUND

Conventional integrated circuits (IC) technology is often implemented to fabricate many semiconductor devices, such as field effect transistors (FETs), bipolar junction transistors (BJTs), diodes, and capacitors, at approximately a same level on a single integrated-circuit (IC) chip.

To integrate different semiconductor devices at approximately a same level on a single IC chip may have many disadvantages. For example, more lithography and other consequent process steps often need to be implemented to fabricate various devices individually in the advanced technology, which often increases the fabrication costs and complexity. In addition, expensive lithography processes are usually needed as the size of each device and the spacing between the devices decrease. Besides, it is complex and difficult to integrate various devices with different substrates or channel materials in the same level.

SUMMARY

In accordance with the teachings described herein, systems and methods are provided for fabricating a semiconductor device structure. An example semiconductor device structure includes a first device layer and a second device layer formed on a first device layer. The first device layer is formed on a substrate and includes a first channel structure configured to conduct a first current, the first channel structure including a first material capable of sustaining a first processing temperature. The second device layer includes a second channel structure configured to conduct a second current, the second channel structure including a second material capable of sustaining a second processing temperature, the second processing temperature being equal to or lower than the first processing temperature.

In one embodiment, a method is provided for fabricating a semiconductor device structure. A first material capable of sustaining a first processing temperature is selected. A first device layer is formed on a substrate. The first device layer includes a first channel structure for conducting a first current, and the first channel structure includes the first material. A second material capable of sustaining a second processing temperature is selected. The second processing temperature is equal to or lower than the first processing temperature. A second device layer is formed on the first device layer. The second device layer includes a second channel structure for conducting a second current, and the second channel structure includes the second material.

In another embodiment, a semiconductor device structure includes a first device layer and a second device layer. The first device layer is formed on a substrate and includes a first channel structure configured to conduct a first current. The first channel structure includes a first material capable of sustaining a first thermal budget associated with fabrication of the first device layer and a second thermal budget. The second device layer is formed on the first device layer and includes a second channel structure configured to conduct a second current. The second channel structure includes a second material capable of sustaining the second thermal budget associated with fabrication of the second device layer.

DETAILED DESCRIPTION

Figure 1:
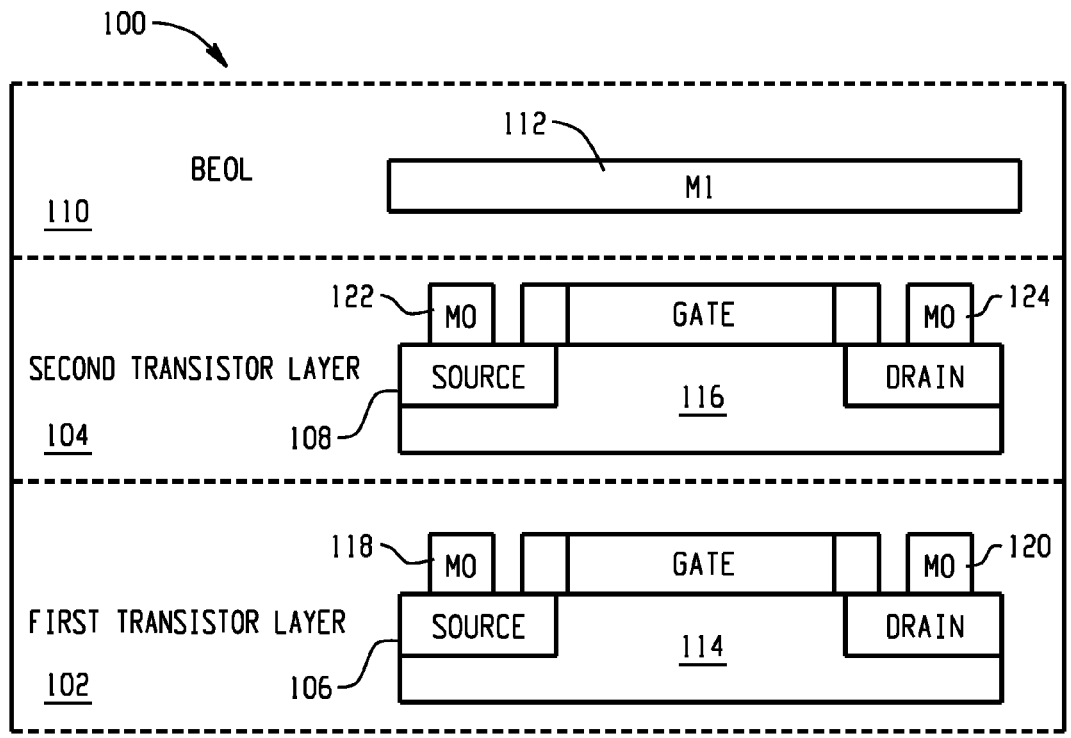
FIG. 1 depicts an example diagram showing a multi-layer semiconductor device structure.
Figure 2:
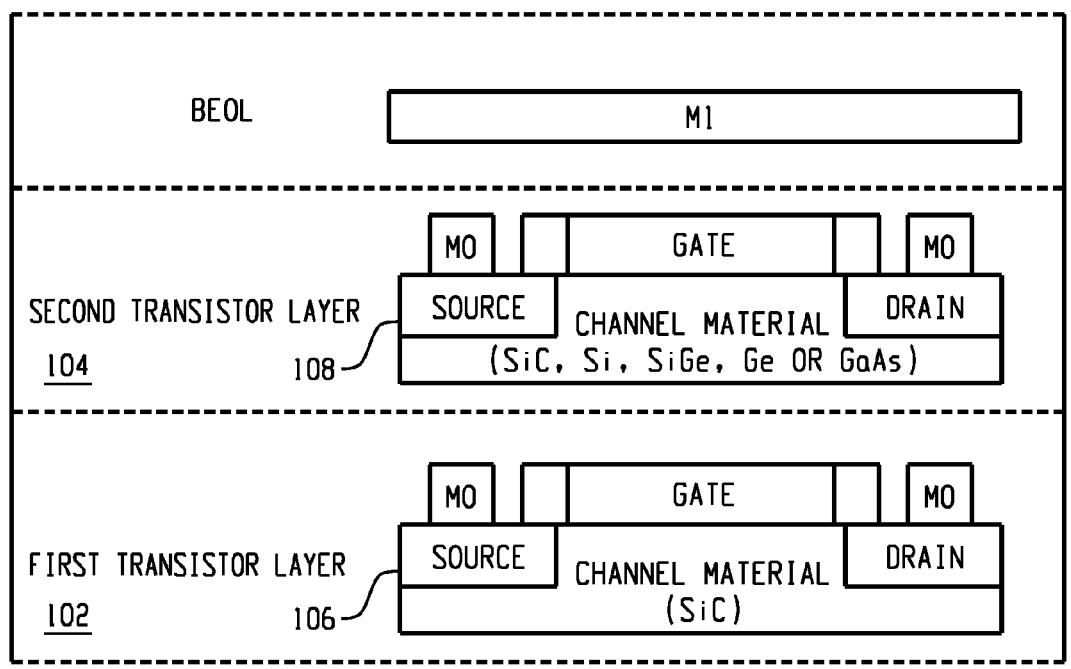
FIGS. 2-6 depict example diagrams showing semiconductor devices at different device layers having different channel materials.
Figure 3:
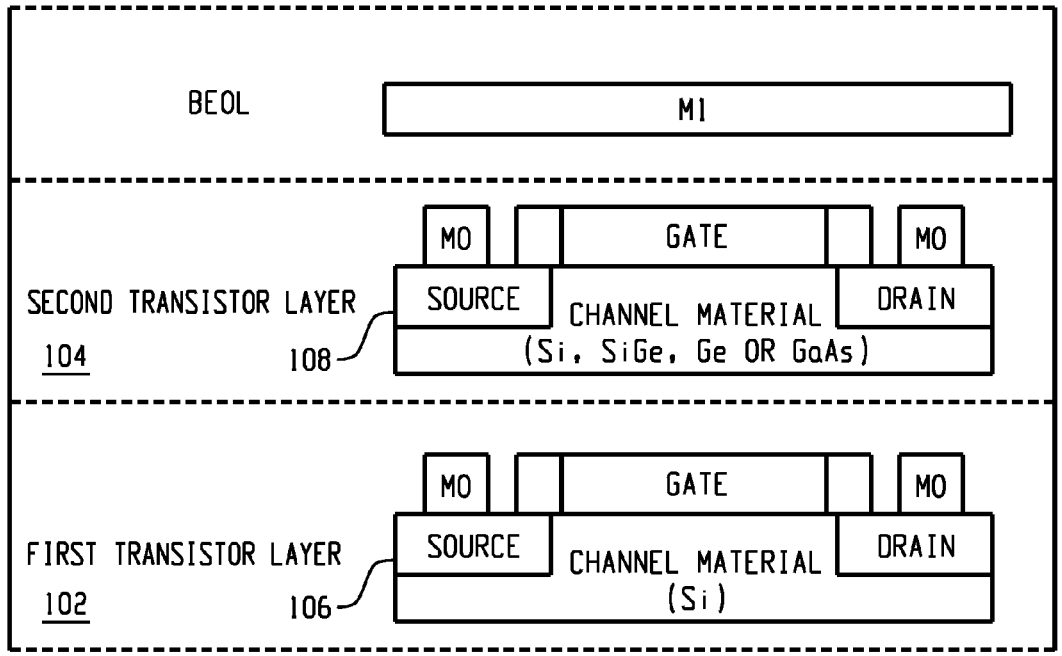
Figure 4:
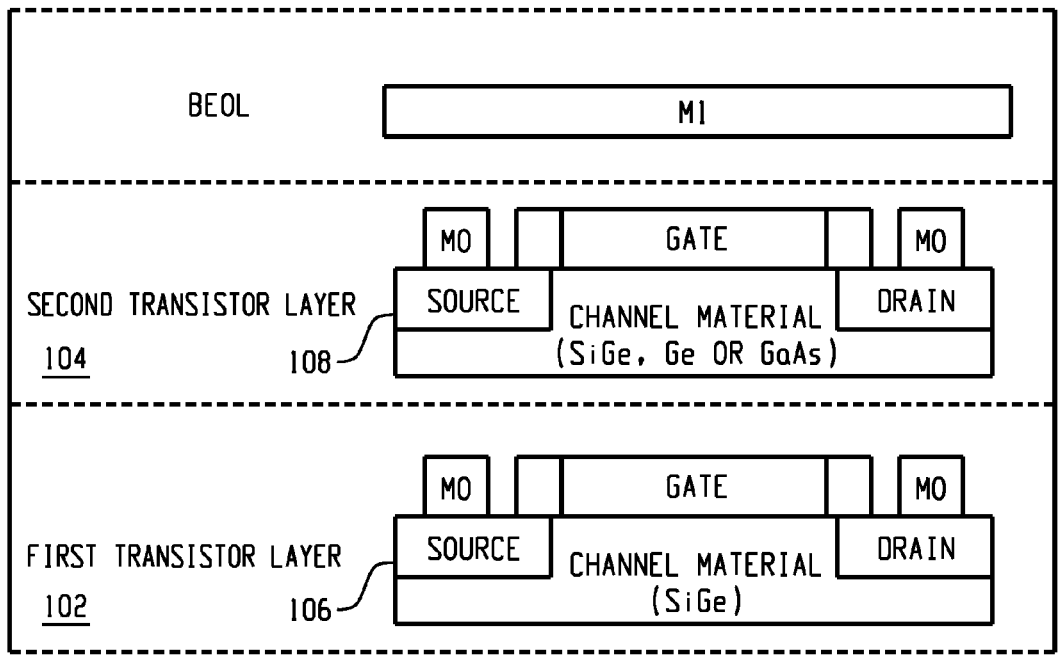
Figure 5:
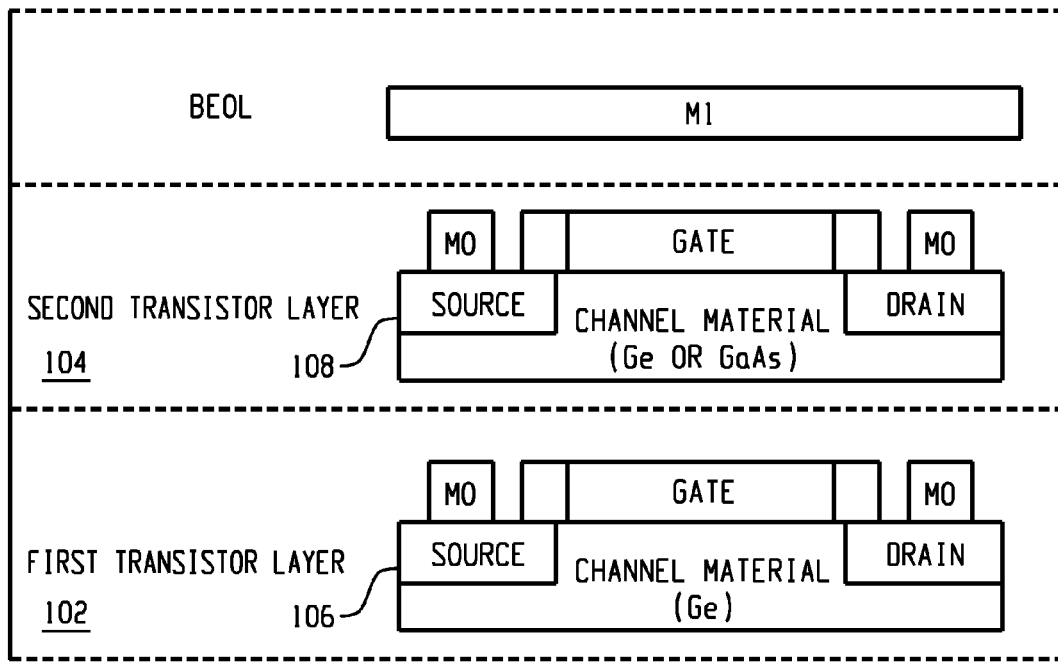
Figure 6:
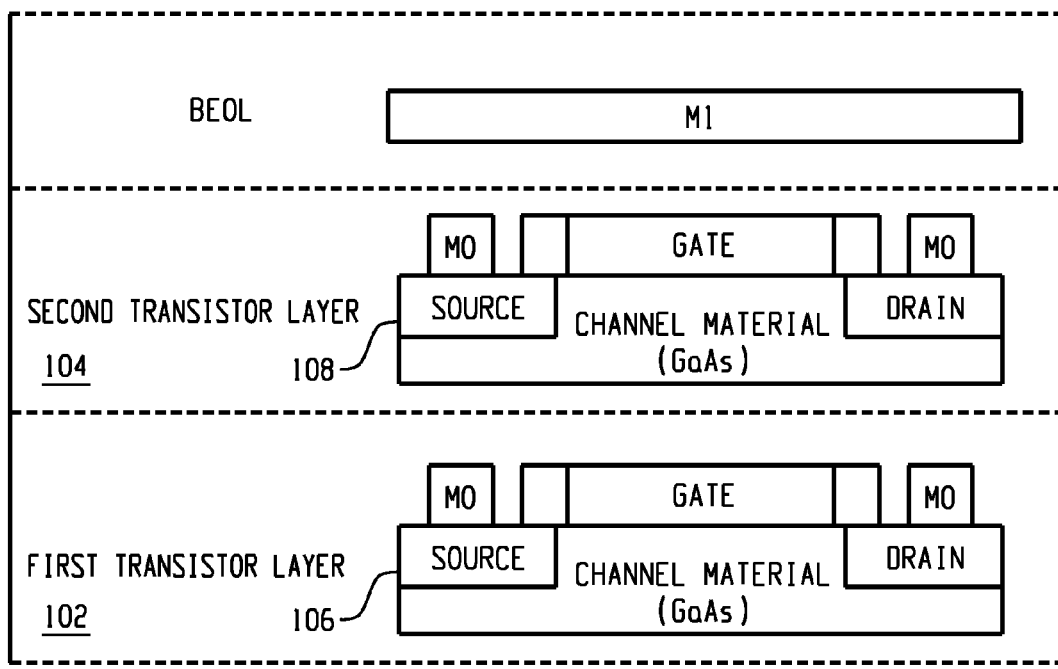

FIG. 1 depicts an example diagram showing a multi-layer semiconductor device structure. The semiconductor device structure 100 may include multiple device layers (e.g., the device layers 102 and 104) which may be used to fabricate one or more semiconductor devices, such as metal-oxide-semiconductor field effect transistors (MOSFETs), FinFETs, BJTs, diodes, capacitors, etc. For example, transistors 106 and 108 may be fabricated in the device layers 102 and 104, respectively. A back-end-of-line device layer 110 including a conductive layer 112 (e.g., including a metal layer or a polycrystalline silicon layer) may be formed for interconnecting individual devices fabricated in other device layers, such as the device layers 102 and 104.

In one embodiment, the device layer 102 may be formed on a substrate. One or more semiconductor devices may be fabricated during the formation of the device layer 102. Then, one or more dielectric layers (e.g., a buried oxide layer, or a high-k dielectric layer), may be formed to cover substantially the device layer 102, for example, through wafer bonding or epitaxy. Such dielectric layers may serve as a base material for the later-formed device layer 104 or as a glue-and-buffer layer between the device layer 102 and the later-formed device layer 104. Similarly, many other device layers may be fabricated one after another to form a stack structure. Then, the layer 110 may be formed through one or more back-end-of-line processes for device interconnection.

As shown in FIG. 1, the transistor 106 includes a channel structure 114 that may be configured to conduct a current flowing between a source electrode 118 and a drain electrode 120 in operation. Similarly, the transistor 108 also includes a channel structure 116 which may be configured to conduct a current flowing between a source electrode 122 and a drain electrode 124 in operation. For example, the transistor 106 including the channel structure 114 may be fabricated through one or more first processes with elevated temperatures. The channel structure 114 is capable of sustaining a first thermal budget associated with the first processes, i.e., a total amount of thermal energy transferred during the first processes. For example, the first thermal budget is proportional to the temperatures and durations of the first processes. Then, during the fabrication of the transistor 108 which may also include one or more second processes with elevated temperatures, the channel structure 114 may undergo these later processes as well. That is, the channel structure 114 needs to sustain not only the first thermal budget, but also a second thermal budget associated with the second processes, i.e., a total amount of thermal energy transferred during the second processes. For example, the second thermal budget is proportional to the temperatures and durations of the second processes. If the channel structure 114 cannot sustain both the first thermal budget and the second thermal budget, the channel structure 114 and thus the transistor 106 may suffer degradation of the electrical characteristics. Thus, proper selection of channel materials of transistors in different device layers (e.g., the device layers 102 and 104) may improve device performance in the semiconductor device structure 100.

Many semiconductor materials, such as silicon carbide, silicon, silicon germanium, germanium, gallium arsenide, graphite, and carbon nano-tube, are suitable for channel materials because of their respective electrical characteristics. For example, gallium arsenide (GaAs) can provide a high electron mobility which is often needed for a n-channel transistor, and germanium (Ge) can provide a high hole mobility which is often needed for a p-channel transistor. These channel materials may be capable of sustaining different processing temperatures and different thermal budgets. Table 1 lists different processing temperatures of certain channel materials.

TABLE 1

| Materials | Processing temperatures (° C.) | Example thermal budgets |
|---|---|---|
| SiC | >1000 | — |
| Si | ~1000 | — |
| Ge | 300-600 | 600° C. for 1 minute, 580-600° C. for 0.5 minute, 350° C. for 30 minutes, 500° C. for 30 minutes |
| GaAs | 300-400 | — |
| InGaAs | <250-500 | 250° C. for 2 minutes, 350° C. for 1.5 minutes, 600° C. for 1 minute, 600° C. for 15 seconds |
| InAs | <250 | <250° C., <300° C. |
| GaSb | <300-<350 | 600° C.-650° C., 400° C. |

For example, the transistor 106 may be a p-channel MOSFET using Ge as the channel material, and the transistor 108 may be a n-channel MOSFET using GaAs as the channel material. Because the processing temperature of GaAs (e.g., about 300-about 400° C.) may be lower than the processing temperature of Ge (e.g., about 400-about 500° C.), the channel structure 114 including Ge may sustain the fabrication of the transistor 108.

FIGS. 2-6 depict example diagrams showing semiconductor devices at different device layers having different channel materials. These channel materials are selected based on their respective processing temperatures and electrical characteristics. Table 2 summarizes different channel materials selected for different devices.

TABLE 2

| | Channel Materials (FIG. 2) | Channel Materials (FIG. 3) | Channel Materials (FIG. 4) | Channel Materials (FIG. 5) | Channel Materials (FIG. 6) |
|---|---|---|---|---|---|
| Transistor 106 in Device Layer 102 | SiC | Si | SiGe | Ge | GaAs |
| Transistor 108 in Device Layer 104 | SiC, Si, SiGe, Ge, GaAs, or a combination thereof | Si, SiGe, Ge, GaAs, or a combination thereof | SiGe, Ge, GaAs, or a combination thereof | Ge, GaAs, or a combination thereof | GaAs |

Figure 7:
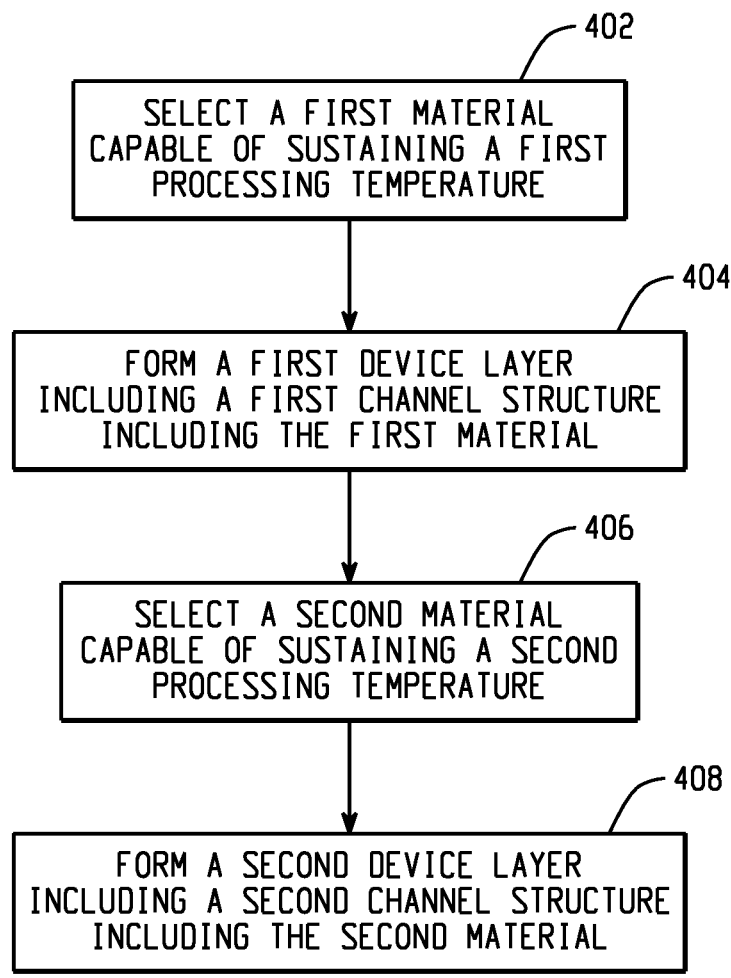
FIG. 7 depicts an example flow chart for fabricating a multi-layer semiconductor device structure.

FIG. 7 depicts an example flow chart for fabricating a multi-layer semiconductor device structure. At 402, a first material capable of sustaining a first processing temperature and a second material capable of sustaining a second processing temperature may be selected, e.g., as channel materials for different device layers. The second processing temperature may be equal to or lower than the first processing temperature. At 404, a first device layer may be formed on a substrate. The first device layer may include a first channel structure for conducting a first current, and the first channel structure may include the first material. At 406, a second device layer may be formed on the first device layer. The second device layer may include a second channel structure for conducting a second current, and the second channel structure may include the second material.

Figure 8:
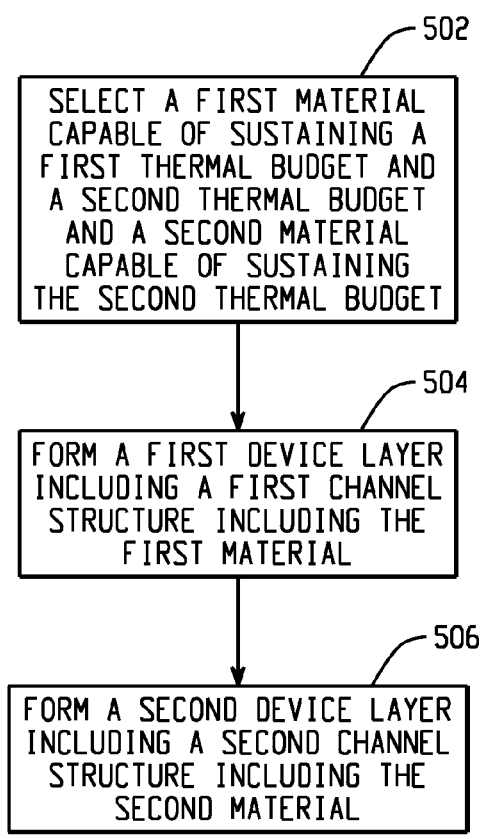
FIG. 8 depicts another example flow chart for fabricating a multi-layer semiconductor device structure.

FIG. 8 depicts another example flow chart for fabricating a multi-layer semiconductor device structure. At 502, a first material capable of sustaining a first thermal budget and a second thermal budget and a second material capable of sustaining a second thermal budget may be selected, e.g., for channel materials of a first device layer and a second device layer respectively. The first thermal budget is associated with fabrication of the first device layer, and the second thermal budget is associated with fabrication of the second device layer. At 504, the first device layer may be formed on a substrate. The first device layer may include a first channel structure for conducting a first current, and the first channel structure may include the first material. At 506, the second device layer may be formed on the first device layer. The second device layer may include a second channel structure for conducting a second current, and the second channel structure may include the second material.

In some embodiments, as silicon-related fabrication processes typically have higher processing temperatures and/or higher thermal budgets than silicon germanium-related fabrication processes, silicon can be selected as the channel material for the first device layer and silicon germanium can be selected as the channel material for the second device layer. For example, the second device layer includes one or more p-channel field-effect transistors (p-FETs), and using silicon germanium as the channel material for the p-FETs can boost hole mobility of the p-FETs.

Figure 9:
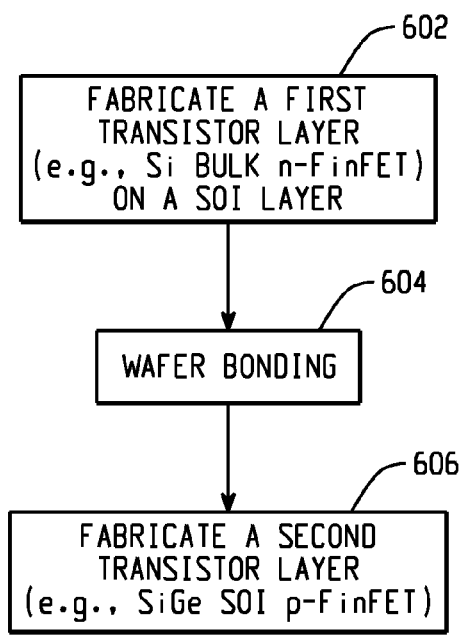
FIG. 9 depicts yet another example flow chart for fabricating a multi-layer semiconductor device structure.

FIG. 9 depicts yet another example flow chart for fabricating a multi-layer semiconductor device structure. At 602, a first transistor layer is fabricated on a silicon-based wafer (e.g., a SOI wafer). For example, the first transistor layer includes one or more n-channel Fin field-effect transistors (n-FinFETs), and silicon is selected to be the channel material for the n-FinFETs. At 604, wafer bonding is performed for fabricating a second transistor layer. At 606, the second transistor layer is fabricated. Here, FinFETs (e.g., bulk FinFETs, SOI FinFETs) are used as merely an example. Other semiconductor devices (e.g., bulk transistors, planar transistors) may be fabricated in the first transistor layer and the second transistor layer. In some embodiments, the first transistor layer needs to sustain not only the thermal budget associated with fabrication of the second transistor layer, but also the thermal budget associated with the consolidation of a bonding interface between the first transistor layer and the transistor device layer.

Figure 12:
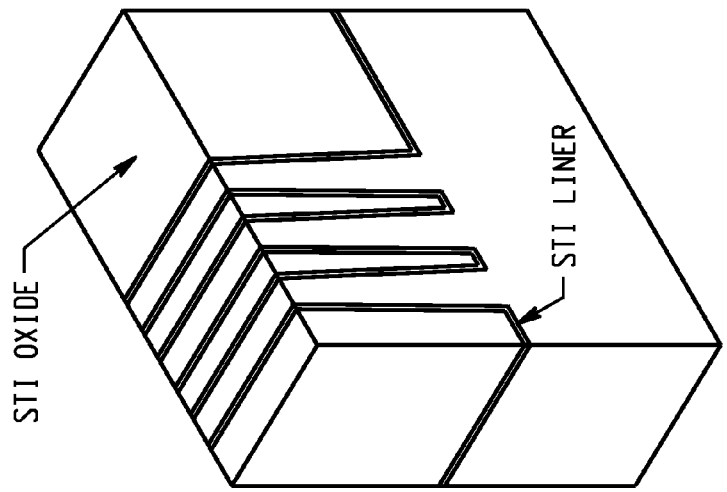
FIG. 10-FIG. 36 depict example diagrams showing certain fabrication processes of a multi-layer semiconductor device structure.
Figure 11:
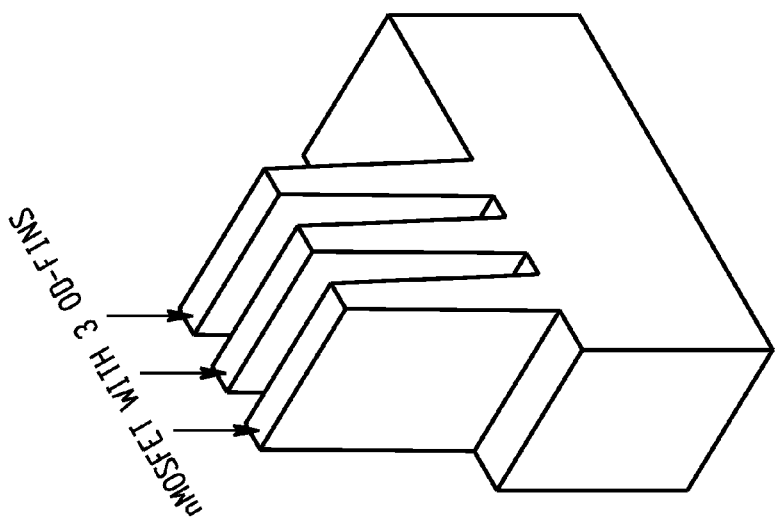
Figure 10:
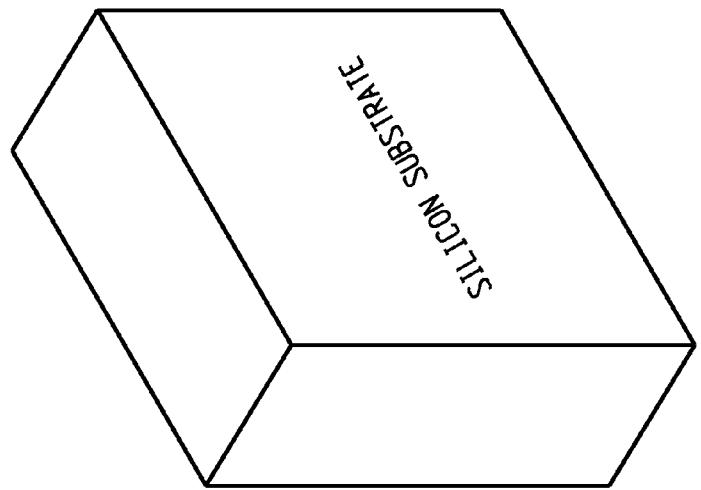

Specifically, exemplary fabrication processes of the multi-layer semiconductor device structure including the first transistor layer and the second transistor layer are shown in FIG. 10-FIG. 36. For example, the silicon-based wafer used for fabricating the first transistor layer is shown in FIG. 10. In some embodiments, the first transistor layer is fabricated through multiple processes. For example, a number of fins (e.g., 3 fins) are fabricated to be active regions of n-FinFETs through photolithography and etching (e.g., dry etching or wet etching) on the silicon-based wafer, as shown in FIG. 11. Shallow-trench-isolation (STI) structures (e.g., STI liners and STI oxides) are fabricated, as shown in FIG. 12. For example, the STI liners are formed (e.g., at about 1000° C.) and then undergoes a high temperature annealing (e.g., at about 1100° C.) to reduce interface damages after etching and to reduce defects between silicon and STI oxides. The STI oxides are formed (e.g., at about 400° C.), and then undergoes a high temperature annealing (e.g., about 1000° C.) to consolidate the STI oxides.

Figure 14:
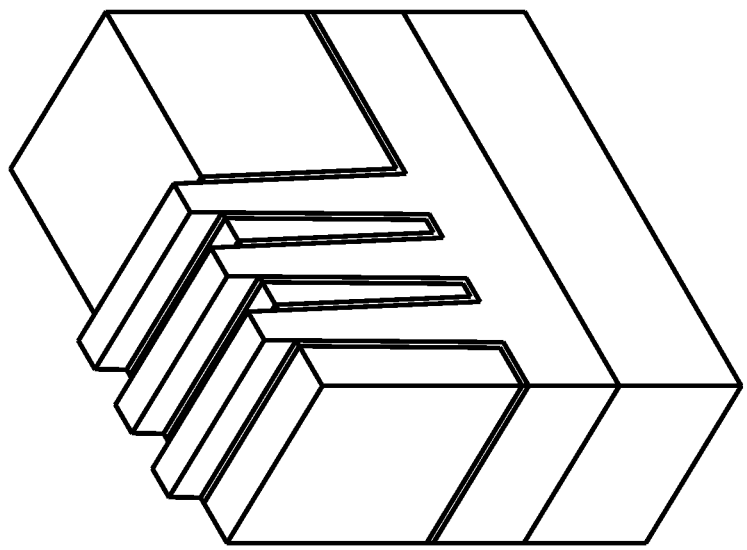
Figure 13:
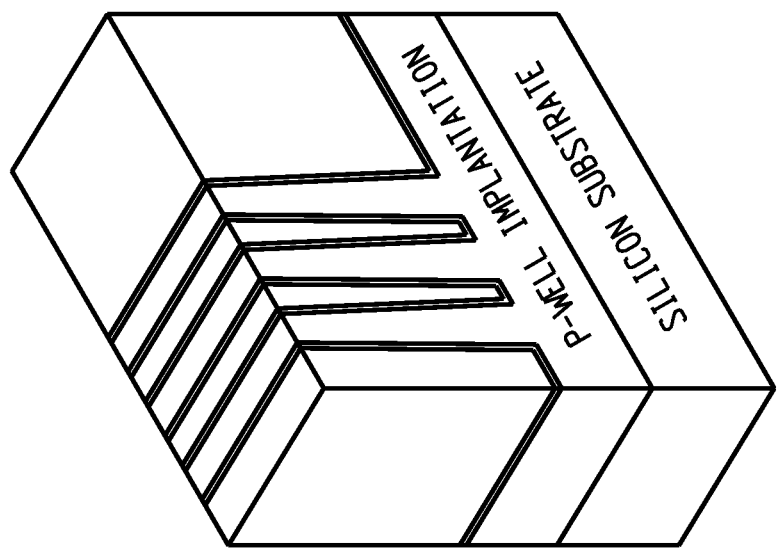
Figure 15:
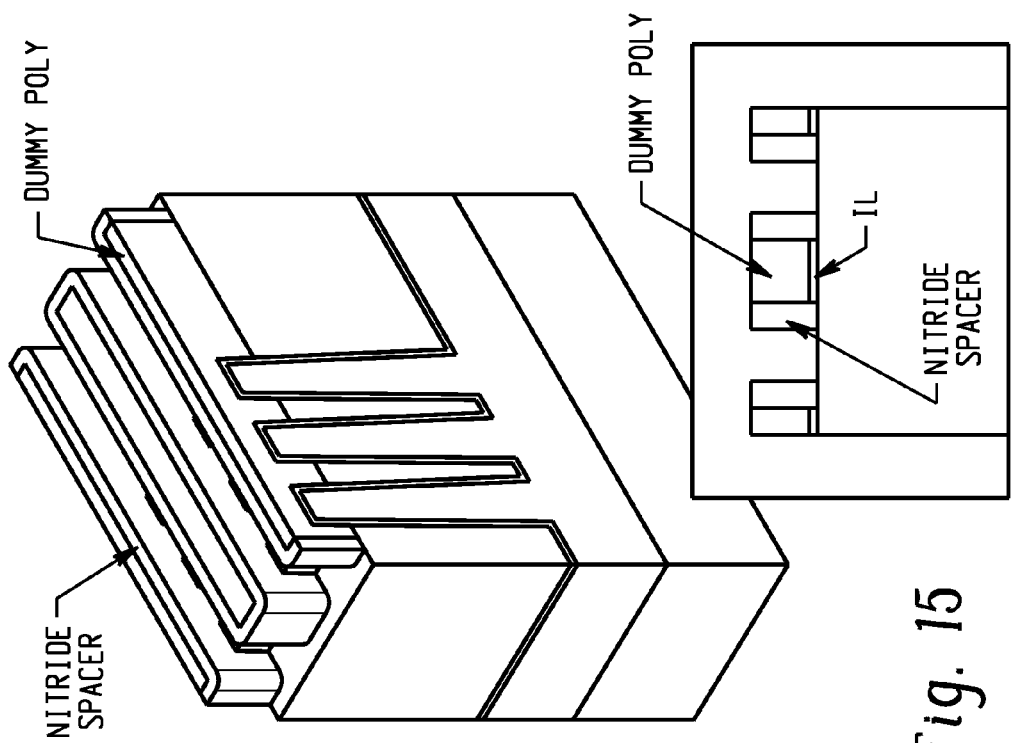

In certain embodiments, well implantation, anti-punch-through (APT) implantation and threshold adjustment (VT) implantation are performed, and a high temperature annealing (e.g., at about 1000° C. for 10 seconds) follows to reduce defects and activate dopants. A chemical-mechanical polishing/planarization (CMP) process is carried out to obtain a structure as shown in FIG. 13. Fin structures as shown in FIG. 14 are formed by removing a certain amount of STI oxides from the wafer. An interfacial layer (IL) is grown on the fin structures. A dummy polysilicon layer is deposited and planarized (e.g., through CMP) thereafter. The dummy polysilicon layer is then patterned through photolithography and etching. The IL layer is etched, and spacers (e.g., silicon nitride, TEOS) are formed (e.g., at about 650° C. to about 700° C.) to generate a structure as shown in FIG. 15.

Figure 16:
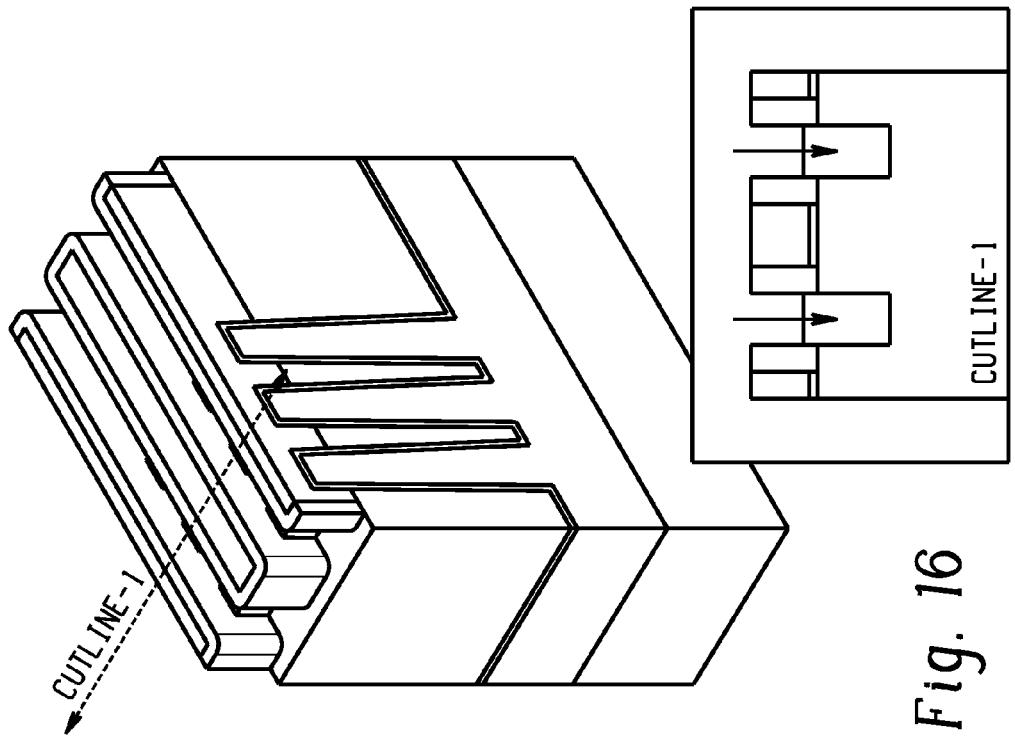
Figure 18:
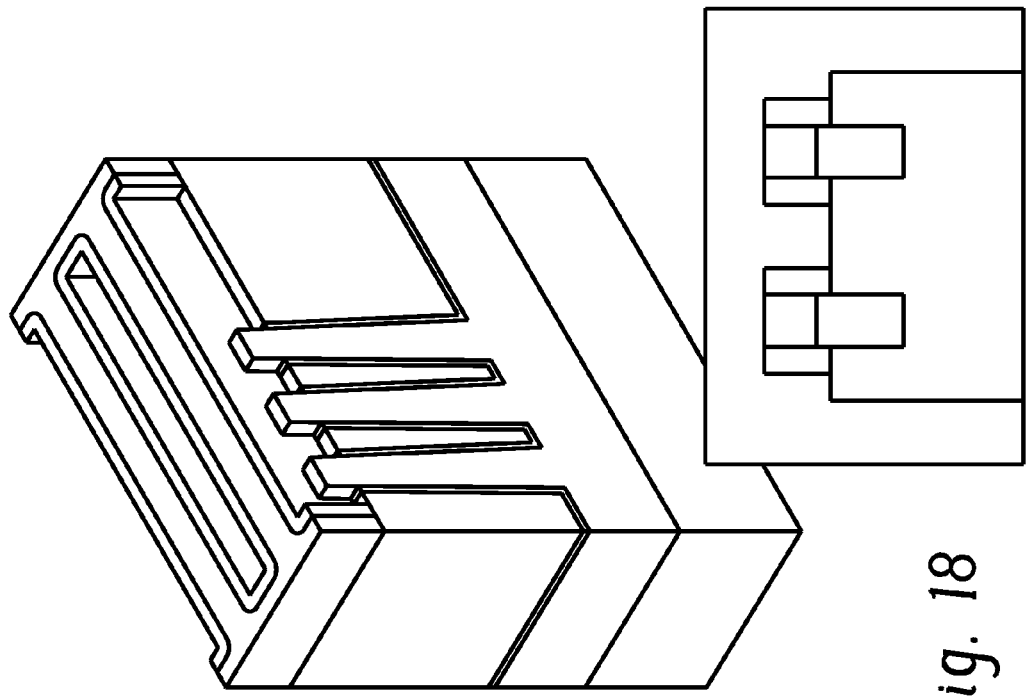
Figure 17:
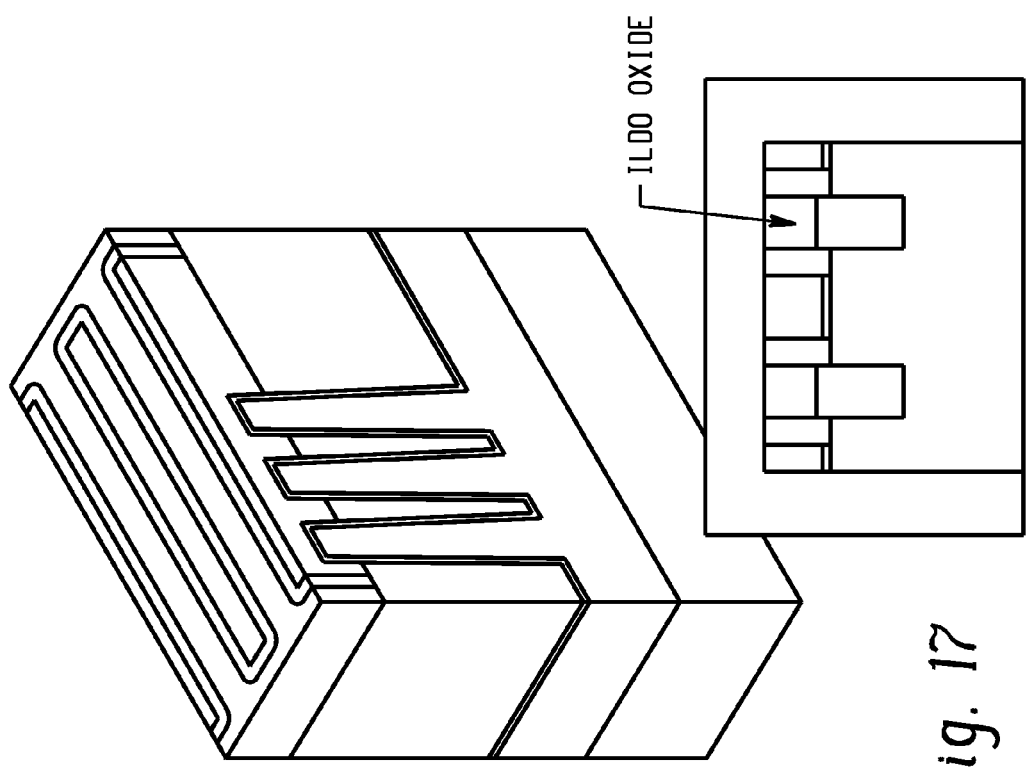
Figure 20:
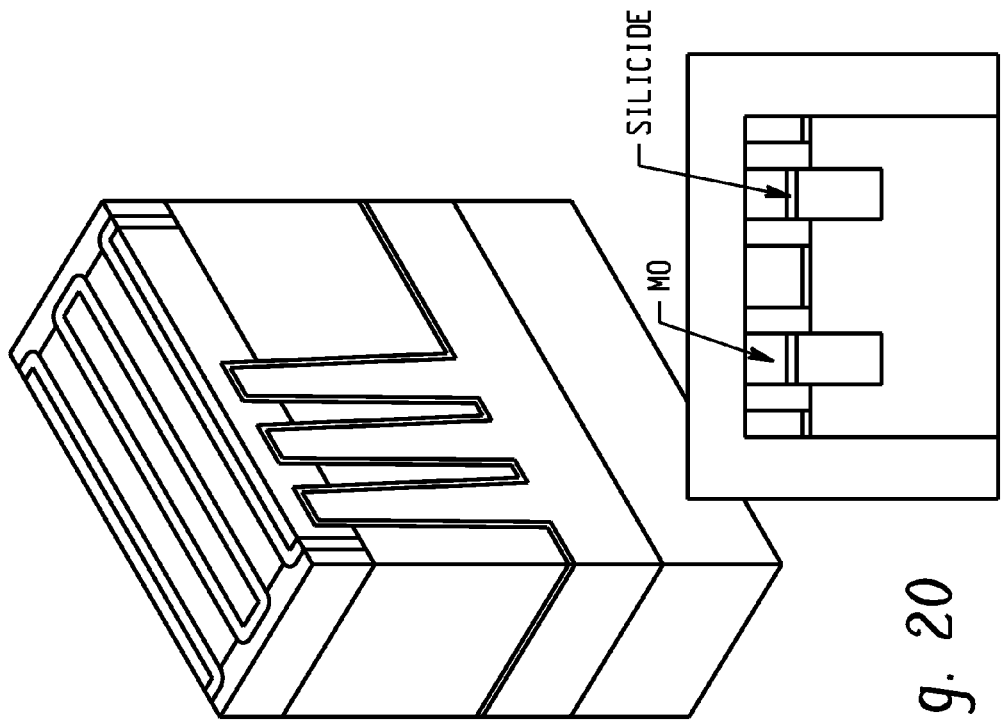
Figure 19:
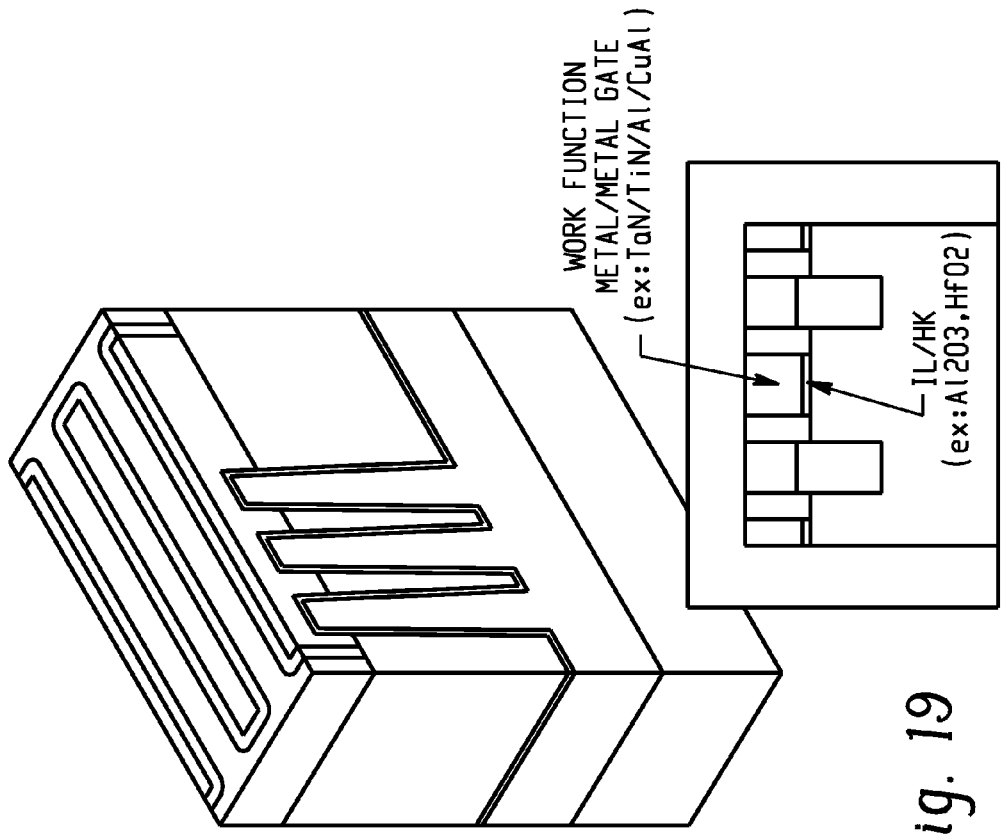
Figure 21:
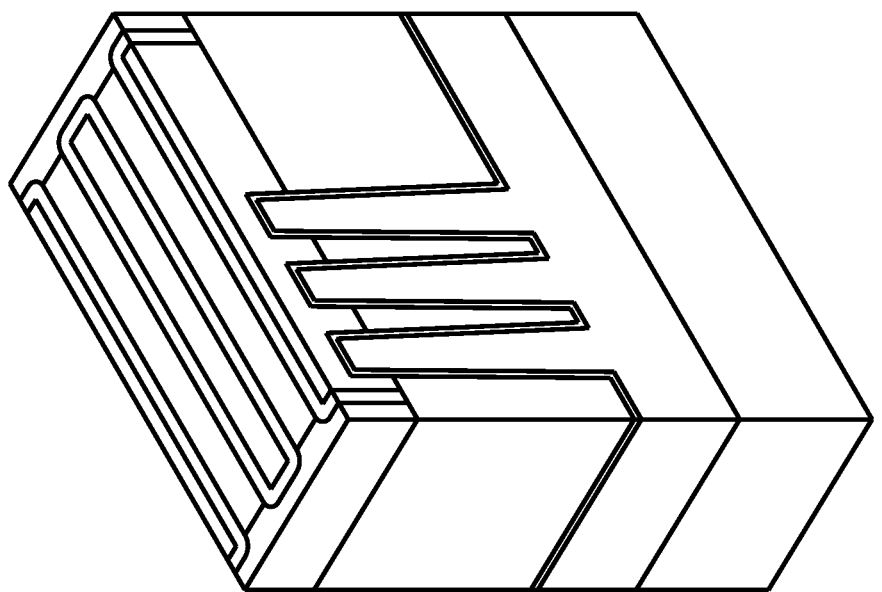

In some embodiments, source/drain regions are grown epitaxially (e.g., at about 680° C. to about 750° C.) with in-situ doping or subsequent implantation, and a high temperature annealing is performed to reduce defects and activate dopants, as shown in FIG. 16. An inter-layer dielectric (ILD) layer is formed and planarized (e.g., through CMP), as shown in FIG. 17. Then, the dummy polysilicon layer and the IL layer are removed (e.g., through etching), as shown in FIG. 18. Another IL layer and a high-k layer (e.g., $Al_2O_3$, $HfO_2$) are formed, for example, through a low-temperature chemical process (e.g., at about 200° C. to about 300° C.), and a low-temperature high-pressure annealing (HPA) process is performed to reduce the interfacial defects. Thereafter, a high temperature annealing (e.g., rapid thermal annealing) is carried out, e.g., at about 800° C. to about 900° C. for a short time period. A metal gate stack (e.g., TaN/TiN/Al/CuAl) is formed, as shown in FIG. 19. Another photolithography and an etching process are implemented to form patterns for silicidation. A silicidation process is then performed, e.g., with an annealing process (e.g., at about 600° C.). A conductive layer (e.g., metal materials) is deposited and planarized, as shown in FIG. 20. As an example, the silicidation process may be replaced by a process of forming a metal-insulator-semiconductor (MIS) contact structure to reduce interface contact resistance and thermal budget. The fabrication of the first transistor layer is completed, as shown in FIG. 21.

Figure 22:
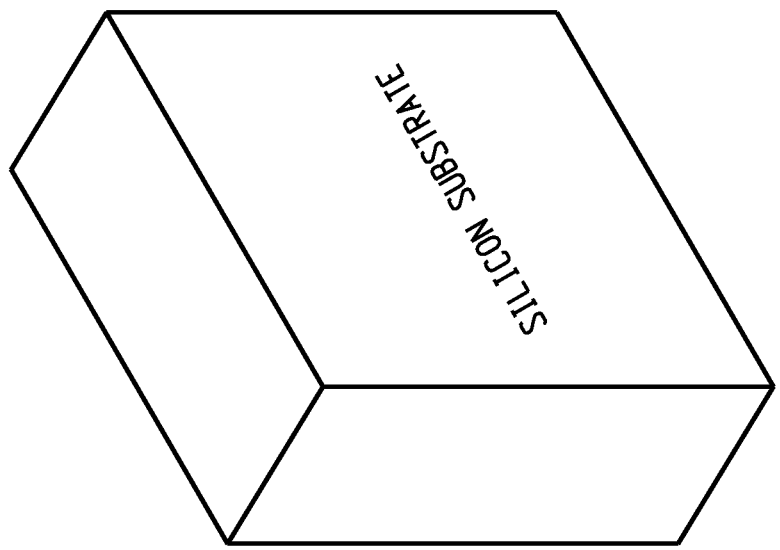
Figure 24:
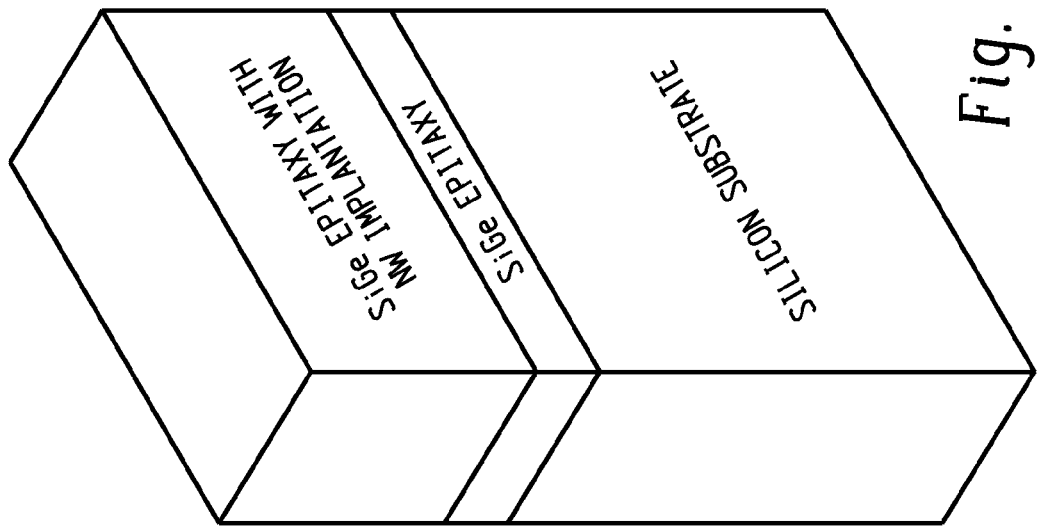
Figure 23:
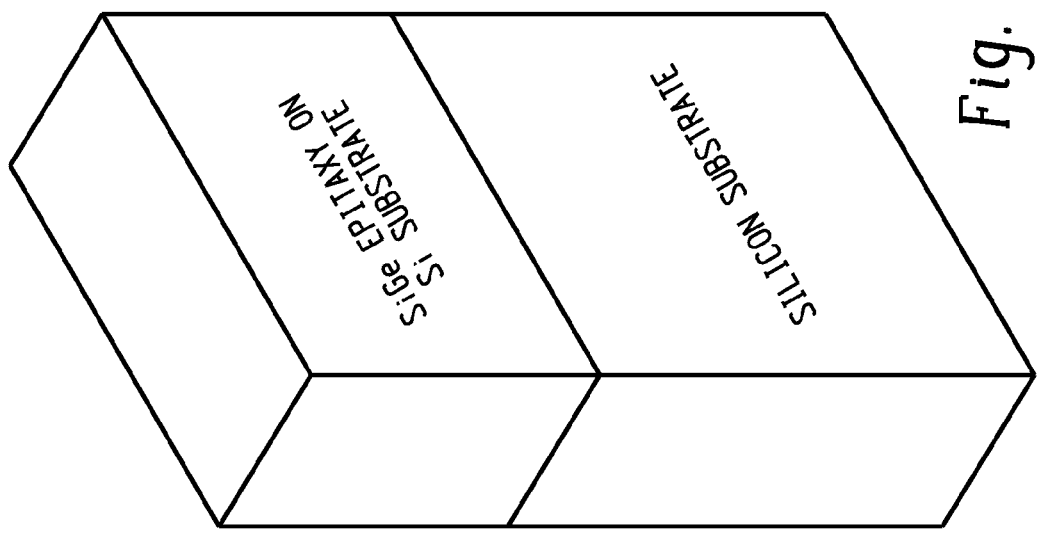
Figure 26:
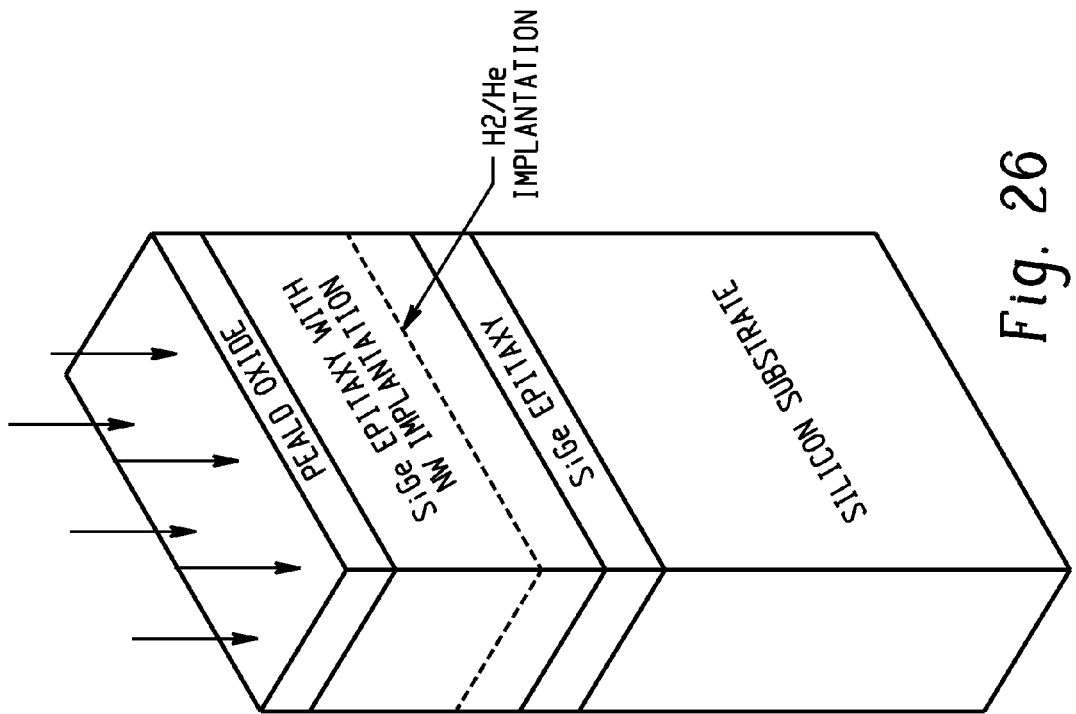
Figure 25:
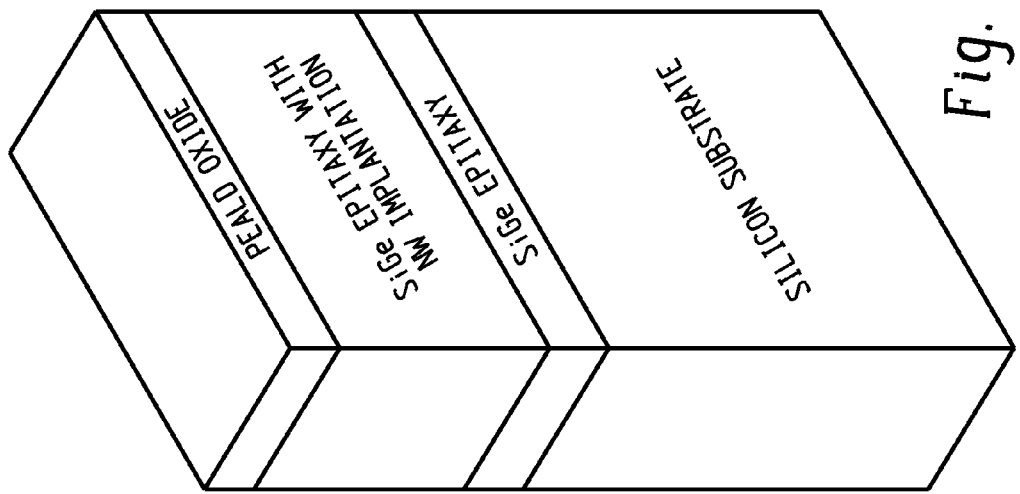
Figure 27:
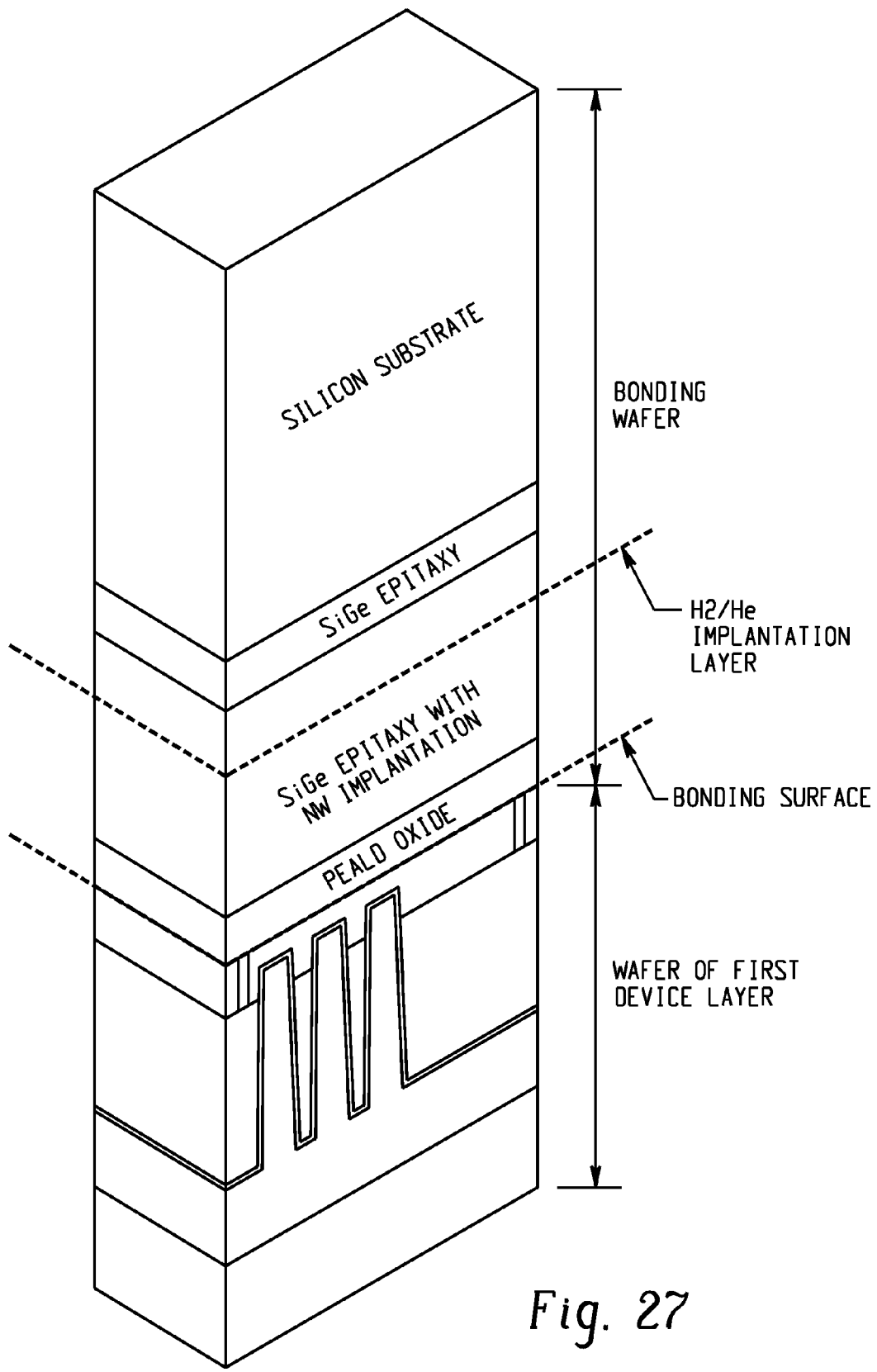
Figure 29:
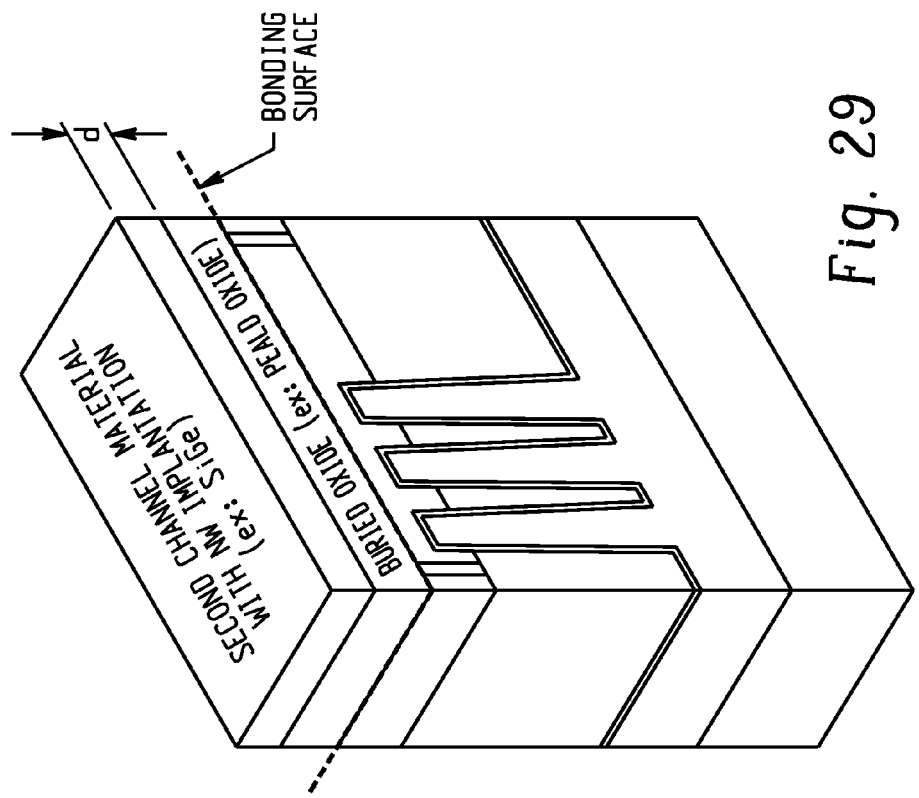
Figure 28:
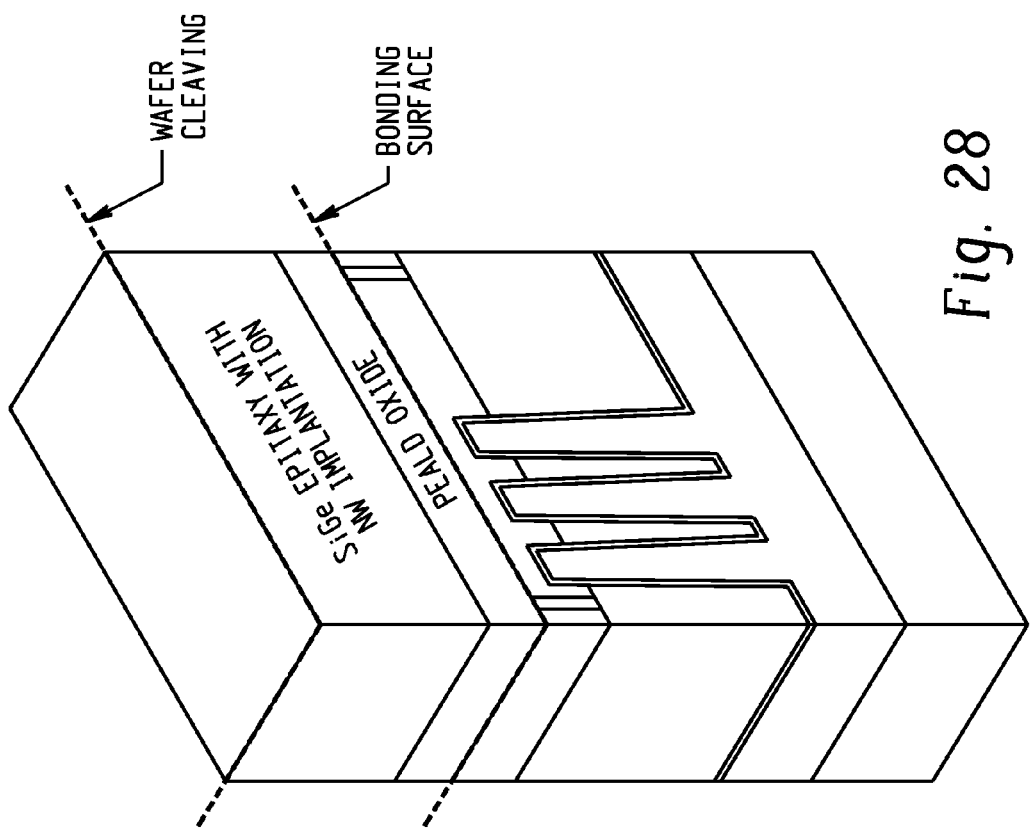

Another silicon-based wafer as shown in FIG. 22 is used as a bonding wafer for fabricating the second transistor layer, independent of the first device layer. For example, the first device layer does not need to sustain the thermal budget associated with the preparation of the bonding wafer. In some embodiments, silicon germanium epitaxy is performed (e.g., at about 560° C. to about 620° C.) on the bonding wafer, as shown in FIG. 23. Then, nano-wire (NW) implantation and a post-implantation annealing are performed, as shown in FIG. 24. Plasma-enhanced atomic layer deposition (PEALD) is implemented to deposit a buried oxide layer (e.g., $SiO_2$, $Al_2O_3$), as shown in FIG. 25. $H_2$/He implantation is performed to reduce interface atom linkage, as shown in FIG. 26. Then, the bonding wafer is fusion-bonded (e.g., front-to-front) to the wafer with the first transistor layer, as shown in FIG. 27. A bonding interface is formed between the buried oxide layer of the bonding wafer and the ILD layer of the first transistor layer. A plasma-enhanced low-temperature annealing may be performed thereafter to consolidate the bonding interface, e.g., at about 300° C. At least part of the bonding wafer (e.g., including the silicon-based substrate and part of the silicon germanium epitaxial layer) is cleaved off, as shown in FIG. 28. The resulting structure includes the wafer containing the first transistor layer, the buried oxide layer, and part of the silicon germanium epitaxial layer. A planarization process (e.g., CMP) is performed to reduce the silicon germanium epitaxial layer to a desired thickness (e.g., d) to serve as the channel material for the second transistor layer, as shown in FIG. 29.

Figure 31:
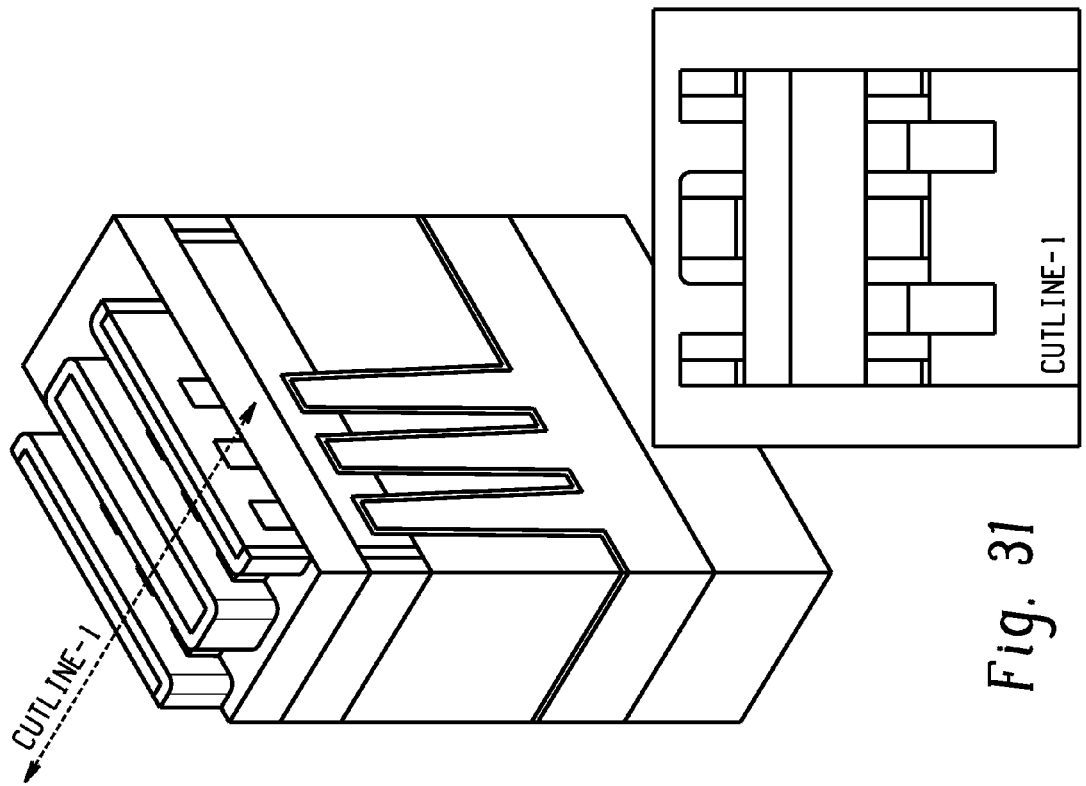
Figure 30:
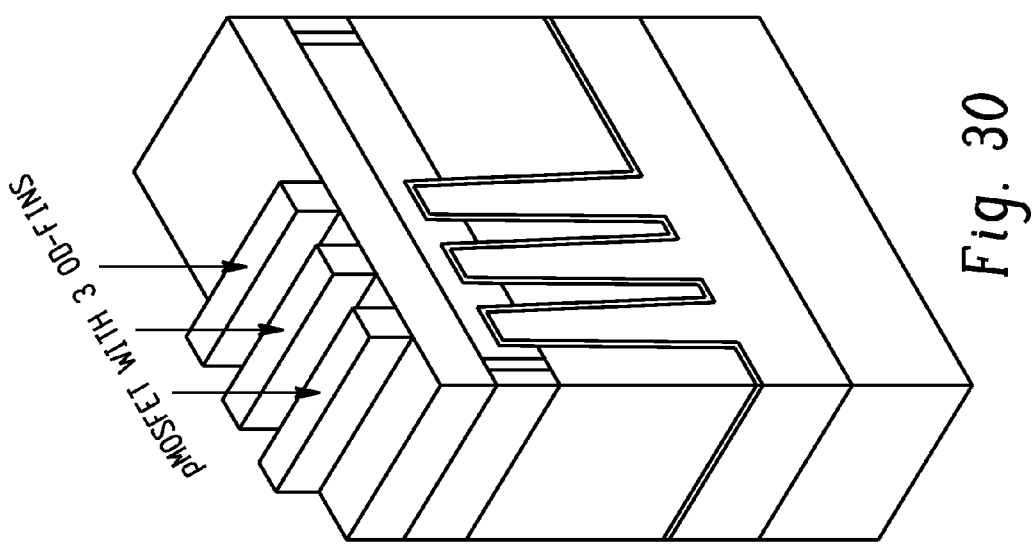
Figure 32:
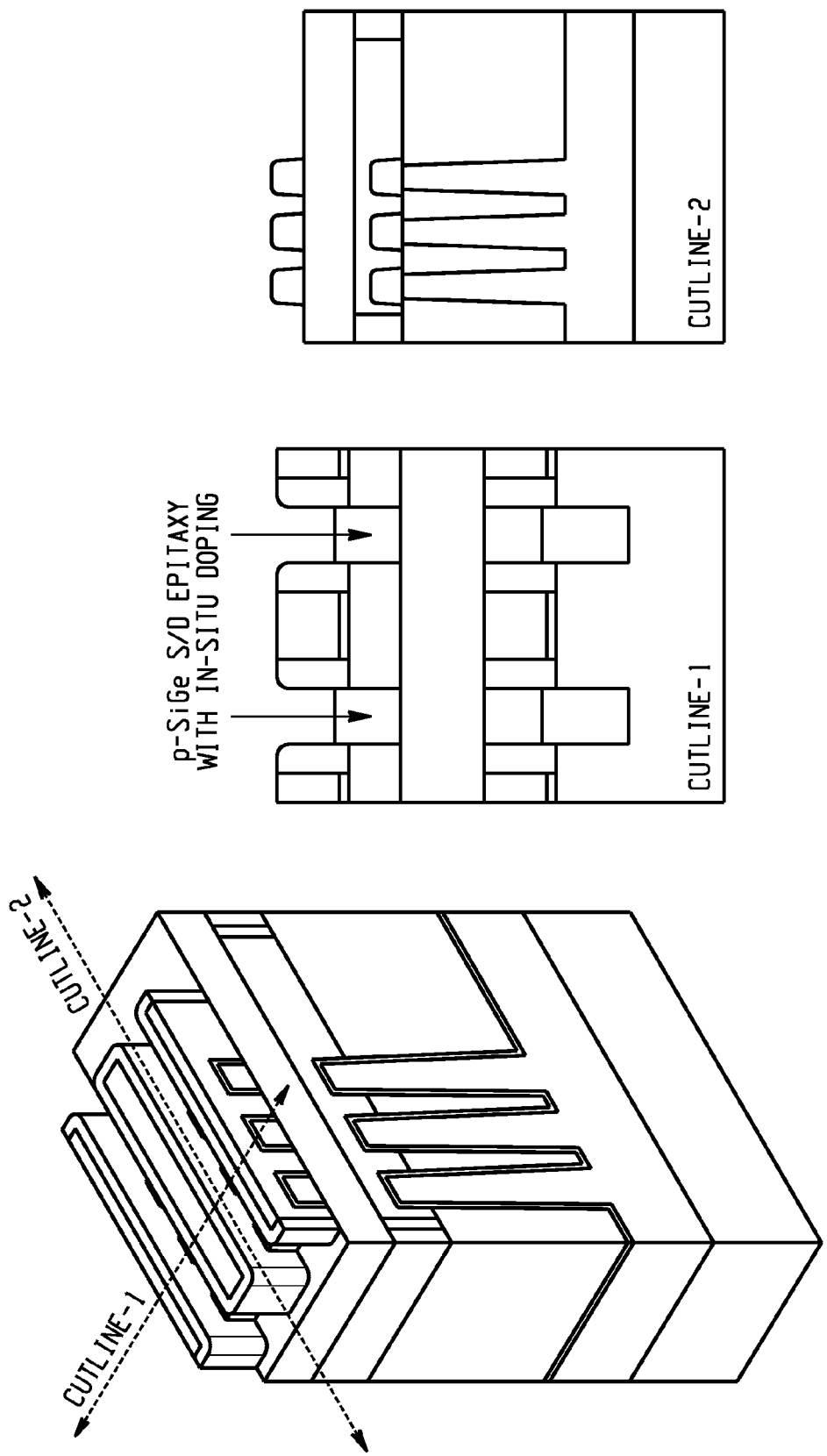
Figure 33:
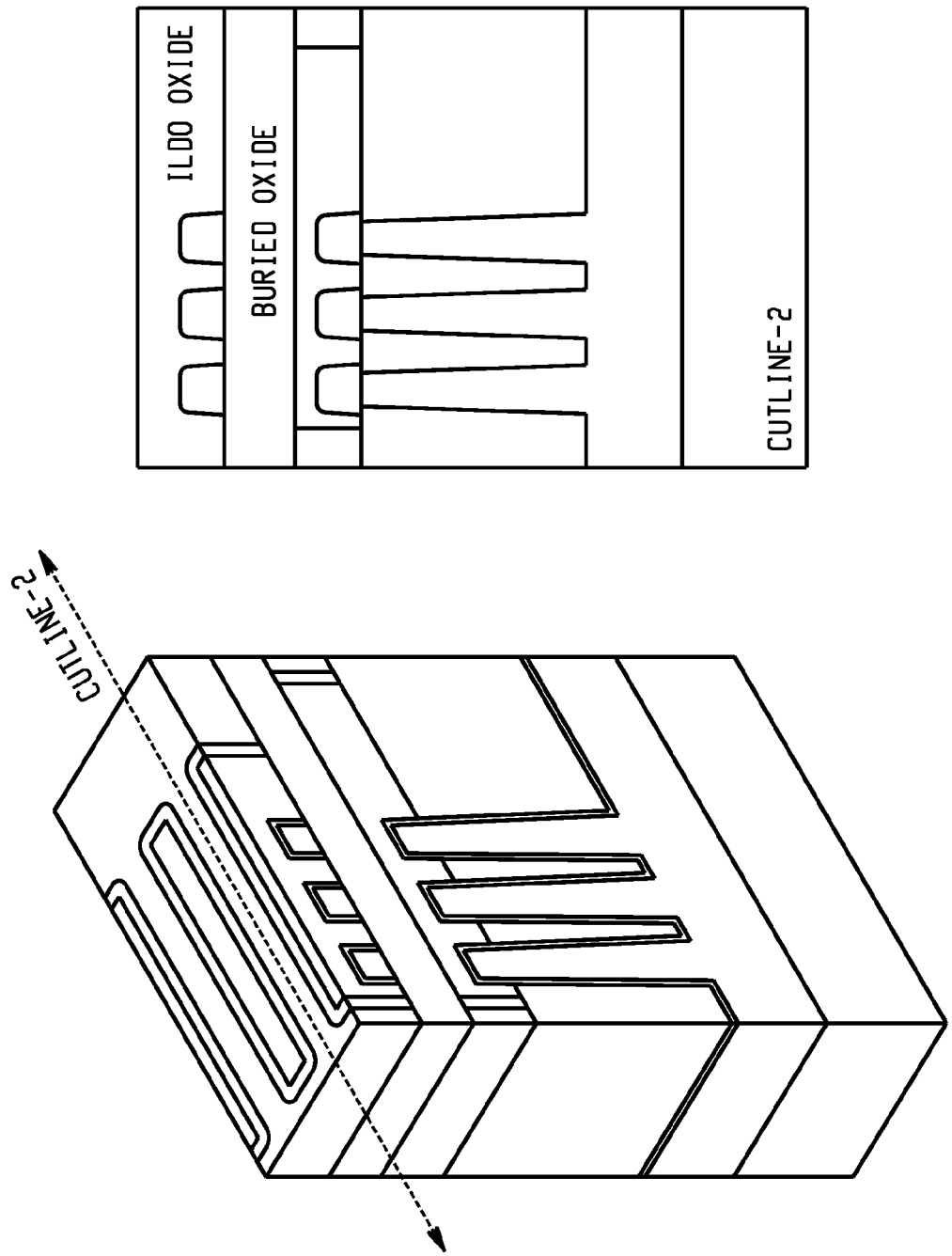
Figure 34:
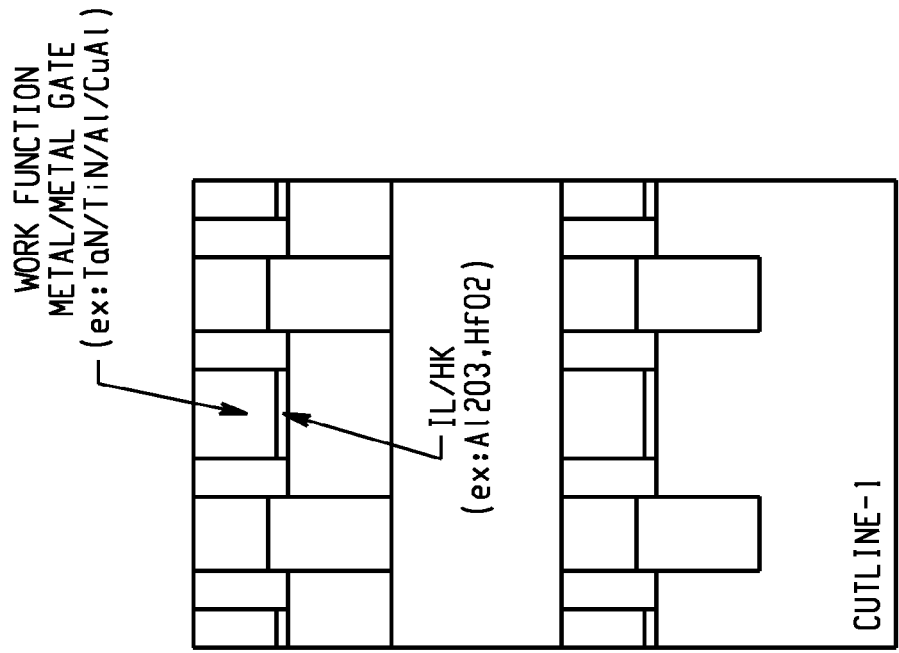
Figure 34:
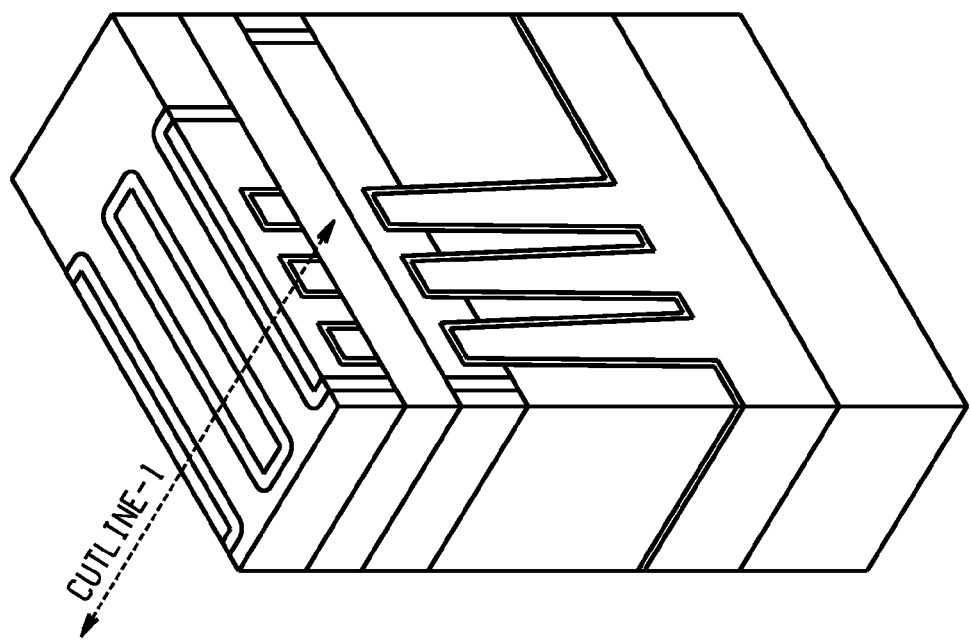
Figure 35:
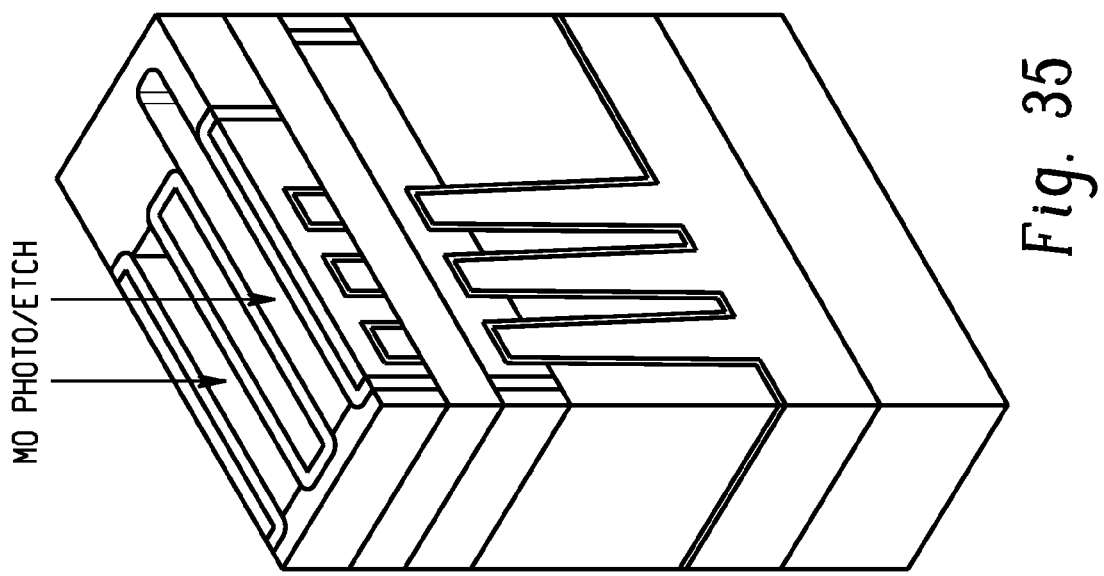
Figure 36:
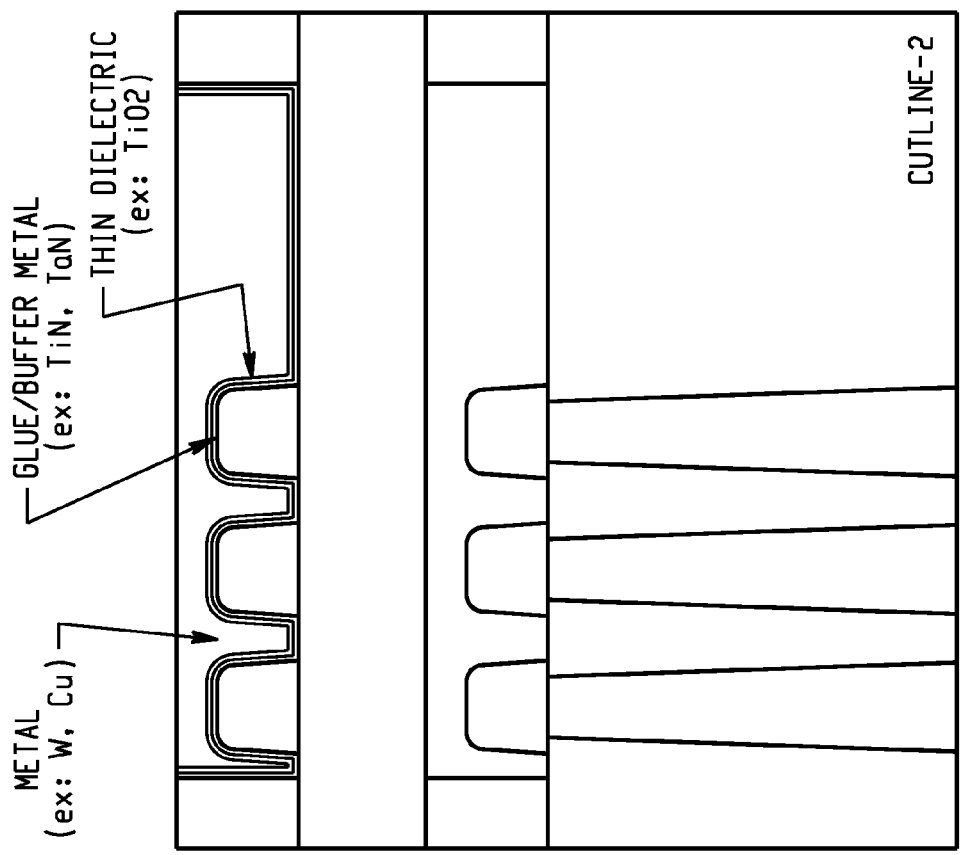
Figure 36:
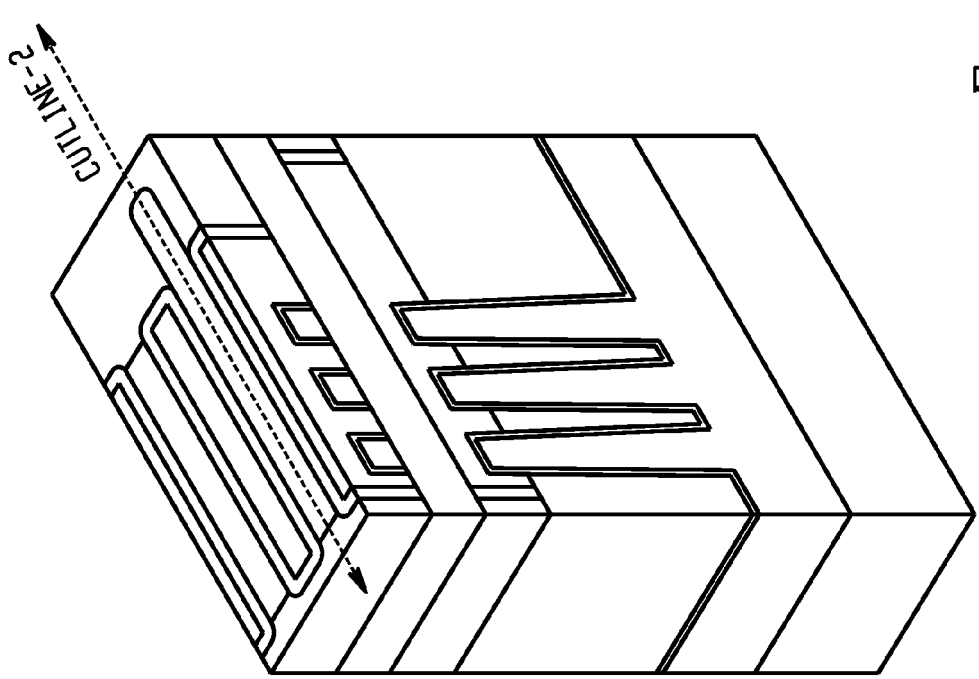

In some embodiments, after photolithography and etching, a number of fins are formed in the silicon germanium epitaxial layer for fabricating p-FinFETs, as shown in FIG. 30. An IL layer is grown, and a dummy polysilicon layer is formed and planarized. Then, another photolithography process and another etching process are carried out to remove the dummy polysilicon layer. The IL layer is removed, and spacers (e.g., silicon nitride, TEOS) are formed, as shown in FIG. 31. Source/drain regions for the p-FinFETs are formed through epitaxy with in-situ doping to avoid a high-temperature annealing process, as shown in FIG. 32. An ILD layer is deposited to separate the active regions in the fins, and the ILD layer is planarized (e.g., through CMP), as shown in FIG. 33. Then, the dummy polysilicon layer and the IL layer are removed (e.g., through etching). Another IL layer and a high-k layer (e.g., $Al_2O_3$, $HfO_2$) are formed through a low-temperature chemical process (e.g., at about 200° C. to about 300° C.), instead of a conventional thermal IL process. A low-temperature high-pressure annealing (HPA) process (e.g., with a deuterium gas) is performed to reduce the interfacial defects, e.g., at about <400° C. Thereafter, a high temperature annealing (e.g., rapid thermal annealing) is carried out, e.g., at about 800° C. to about 900° C. for a short time period. A metal gate stack (e.g., TaN/TiN/Al/CuAl) is formed, as shown in FIG. 34. Another photolithography and an etching process are performed for metal deposition, as shown in FIG. 35. A MIS contact structure is formed through a low-temperature process (e.g., at about 250° C.) to reduce interface contact resistance and thermal budget. For example, a thin dielectric layer (e.g., $TiO_2$) is deposited on the fins, and a glue/buffer metal layer (e.g., TiN, TaN) is deposited on the thin dielectric layer. Thereafter, a conductive layer (e.g., W, Cu) is deposited and planarized (e.g., through CMP), as shown in FIG. 36. The fabrication of the second transistor layer is completed.

As described above, the second transistor layer is fabricated from a SOI structure, where the insulator of the SOI structure is the buried oxide, and thus the high-temperature STI processes related to STI liners and/or STI oxides are omitted in the fabrication of the second transistor layer. In addition, the high-temperature processes for well implantation and APT implantation are not implemented for the fabrication of the second transistor layer. For example, the bottom of the fins in the second transistor layer is isolated by the buried oxide layer, and there is no punch-through leakage path. Furthermore, the VT implantation is carried out on the bonding wafer, and thus may not affect the first transistor layer.

This written description uses examples to disclose the disclosure, include the best mode, and also to enable a person skilled in the art to make and use the disclosure. The patentable scope of the disclosure may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A semiconductor device structure comprising:
a first device layer formed on a substrate and including a first channel structure configured to conduct a first current, the first channel structure including a first material capable of sustaining a first processing temperature; and
a second device layer formed on the first device layer and including a second channel structure configured to conduct a second current, the second channel structure including a second material capable of sustaining a second processing temperature, the second processing temperature being equal to or lower than the first processing temperature,
wherein the first material is further capable of sustaining a first thermal budget proportional to a first processing duration, a second thermal budget proportional to a second processing duration, and a third thermal budget associated with consolidation of a bonding interface between the first device layer and the second device layer.

2. The semiconductor device structure of claim 1, further comprising:
a third device layer formed on the second device layer and including a third channel structure configured to conduct a third current, the third channel structure including a third material capable of sustaining a third processing temperature, the third processing temperature being equal to or lower than the second processing temperature.

3. The semiconductor device structure of claim 1, wherein the first channel structure is formed at the first processing temperature.

4. The semiconductor device structure of claim 1, wherein the second channel structure is formed at the second processing temperature.

5. The semiconductor device structure of claim 1, wherein the first material is selected from the group consisting of: silicon carbide, silicon, silicon germanium, germanium, gallium arsenide, graphite, and carbon nano-tube.

6. The semiconductor device structure of claim 1, wherein the second material is selected from the group consisting of: silicon carbide, silicon, silicon germanium, germanium, gallium arsenide, graphite, and carbon nano-tube.

7. The semiconductor device structure of claim 1, wherein the first material is p-doped or n-doped.

8. The semiconductor device structure of claim 1, wherein the second material is p-doped or n-doped.

9. The semiconductor device structure of claim 1, wherein:
the first device layer includes a first semiconductor device including a first electrode structure, a second electrode structure, and the first channel structure; and
the first electrode structure and the second electrode structure are configured to conduct the first current.

10. The semiconductor device structure of claim 9, wherein the first semiconductor device is selected from the group consisting of: a metal-oxide-semiconductor field effect transistor, a Fin field effect transistor, a bipolar junction transistor, a diode, a capacitor, and a memory device.

11. The semiconductor device structure of claim 9, wherein:
the first semiconductor device includes a transistor including a source electrode, a drain electrode, and a channel region;
the first electrode structure corresponds to the source electrode;
the second electrode structure corresponds to the drain electrode; and
the first channel structure corresponds to the channel region.

12. The semiconductor device structure of claim 9, wherein:
the second device layer includes a second semiconductor device including a third electrode structure, a fourth electrode structure and the second channel structure; and
the third electrode structure and the fourth electrode structure are configured to conduct the second current.

13. The semiconductor device structure of claim 12, wherein:
the second semiconductor device includes a transistor including a source electrode, a drain electrode, and a channel region;
the third electrode structure corresponds to the source electrode;
the fourth electrode structure corresponds to the drain electrode; and
the second channel structure corresponds to the channel region.

14. The semiconductor device structure of claim 12, wherein the second semiconductor device is selected from the group consisting of: a metal-oxide-semiconductor field effect transistor, a Fin field effect transistor, a bipolar junction transistor, a diode, a capacitor, and a memory device.

15. A method for fabricating a semiconductor device structure, the method comprising:
selecting a first material capable of sustaining a first processing temperature and a second material capable of sustaining a second processing temperature equal to or lower than the first processing temperature;
forming a first device layer on a substrate, the first device layer including a first channel structure for conducting a first current, the first channel structure including the first material; and
forming a second device layer on the first device layer, the second device layer including a second channel structure for conducting a second current, the second channel structure including the second material,
wherein the selection of the first material further comprises selecting the first material further capable of sustaining a first thermal budget proportional to a first processing duration, a second thermal budget proportional to a second processing duration, and a third thermal budget associated with consolidation of a bonding interface between the first device layer and the second device layer.

16. The method of claim 15, wherein the first channel structure is formed at the first processing temperature.

17. The method of claim 15, wherein the second channel structure is formed at the second processing temperature.

18. The method of claim 15, wherein the first material is selected from the group consisting of: silicon carbide, silicon, silicon germanium, germanium, gallium arsenide, graphite, and carbon nano-tube.

19. The method of claim 15, wherein the second material is selected from the group consisting of: silicon carbide, silicon, silicon germanium, germanium, gallium arsenide, graphite, and carbon nano-tube.

20. A semiconductor device structure comprising:
a first device layer formed on a substrate and including a first channel structure configured to conduct a first current, the first channel structure including a first material capable of sustaining a first thermal budget associated with fabrication of the first device layer and a second thermal budget; and
a second device layer formed on the first device layer and including a second channel structure configured to conduct a second current, the second channel structure including a second material capable of sustaining the second thermal budget associated with fabrication of the second device layer,
wherein the first material is further capable of sustaining the first thermal budget proportional to a first processing duration, the second thermal budget proportional to a second processing duration, and a third thermal budget associated with consolidation of a bonding interface between the first device layer and the second device layer.

* * * * *